United States Patent
Sugimoto

(10) Patent No.: US 11,385,707 B2
(45) Date of Patent: Jul. 12, 2022

(54) POWER-SUPPLY DETECTION-CIRCUIT CONTROL METHOD AND CIRCUIT SYSTEM

(71) Applicant: Mitsubishi Electric Corporation, Tokyo (JP)

(72) Inventor: Takaaki Sugimoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/270,704

(22) PCT Filed: Oct. 19, 2018

(86) PCT No.: PCT/JP2018/038937
§ 371 (c)(1),
(2) Date: Feb. 23, 2021

(87) PCT Pub. No.: WO2020/079823
PCT Pub. Date: Apr. 23, 2020

(65) Prior Publication Data
US 2021/0333859 A1 Oct. 28, 2021

(51) Int. Cl.
*G06F 1/00* (2006.01)
*G06F 1/3287* (2019.01)
*G06F 1/28* (2006.01)
*G06F 1/3206* (2019.01)

(52) U.S. Cl.
CPC .............. *G06F 1/3287* (2013.01); *G06F 1/28* (2013.01); *G06F 1/3206* (2013.01)

(58) Field of Classification Search
None
See application file for complete search history.

(56) References Cited

U.S. PATENT DOCUMENTS

| | | | |
|---|---|---|---|
| 7,900,081 B2 | 3/2011 | Kobayashi et al. | |
| 2002/0180497 A1* | 12/2002 | Kim | G06F 1/32 327/143 |
| 2013/0113532 A1* | 5/2013 | Lee | G06F 1/30 327/143 |

FOREIGN PATENT DOCUMENTS

| | | |
|---|---|---|
| JP | 2006-350930 A | 12/2006 |
| JP | 2008-052699 A | 3/2008 |
| JP | 2009-116851 A | 5/2009 |

OTHER PUBLICATIONS

International Search Report dated Dec. 18, 2018, issued in corresponding international application PCT/JP2018/038937 (and English translation).

* cited by examiner

Primary Examiner — Nitin C Patel
(74) Attorney, Agent, or Firm — Posz Law Group, PLC

(57) ABSTRACT

A power-supply detection-circuit control method is a method for a first microcomputer to control operation of a power-supply detection circuit, the first microcomputer being connected to the power-supply detection circuit and controlling a fan motor, the power-supply detection circuit detecting a voltage to be applied from a power supply to the fan motor, wherein the first microcomputer switches the power-supply detection circuit between an operating state and a non-operating state on the basis of information indicating whether a predetermined condition is satisfied.

3 Claims, 3 Drawing Sheets

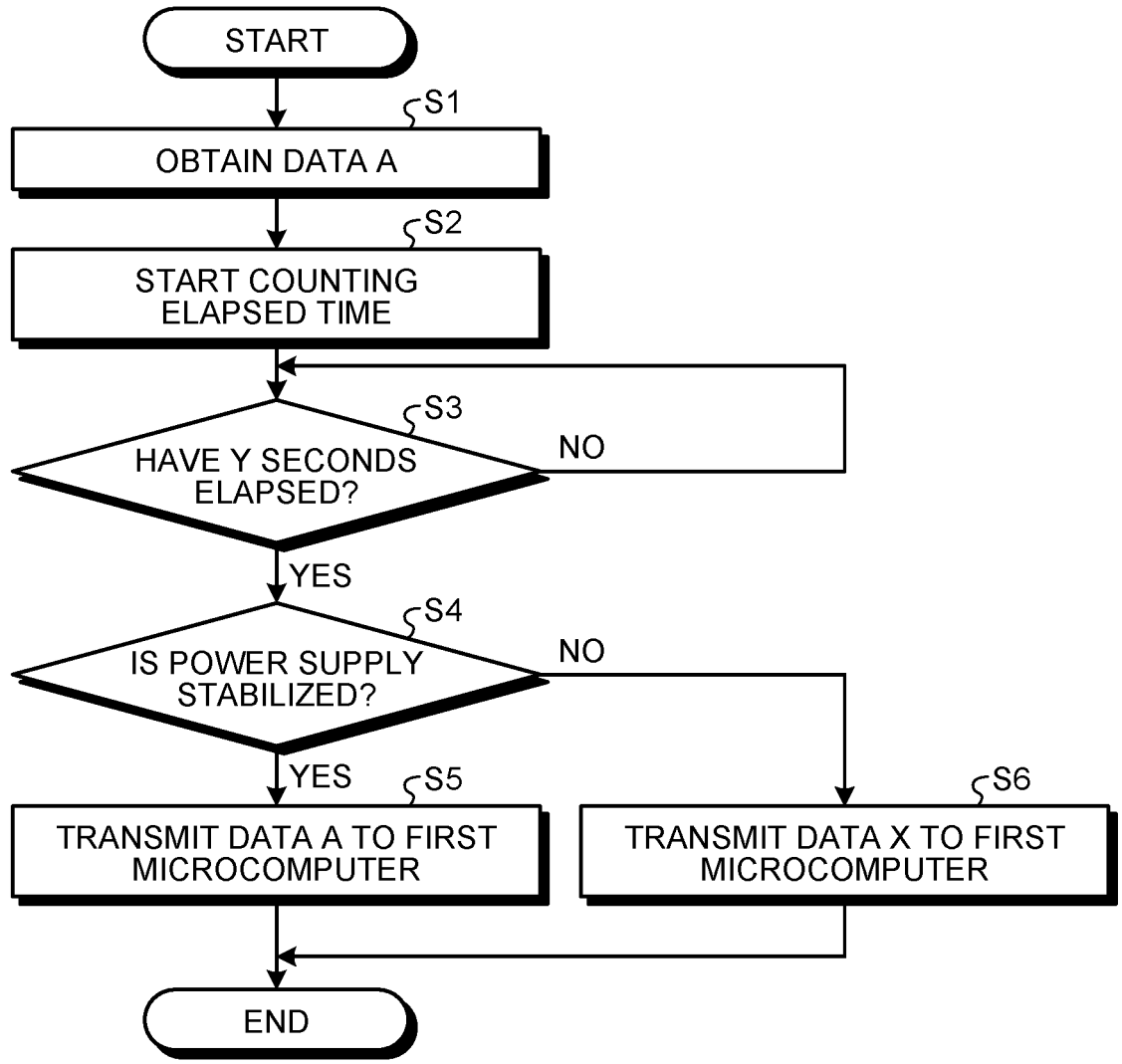

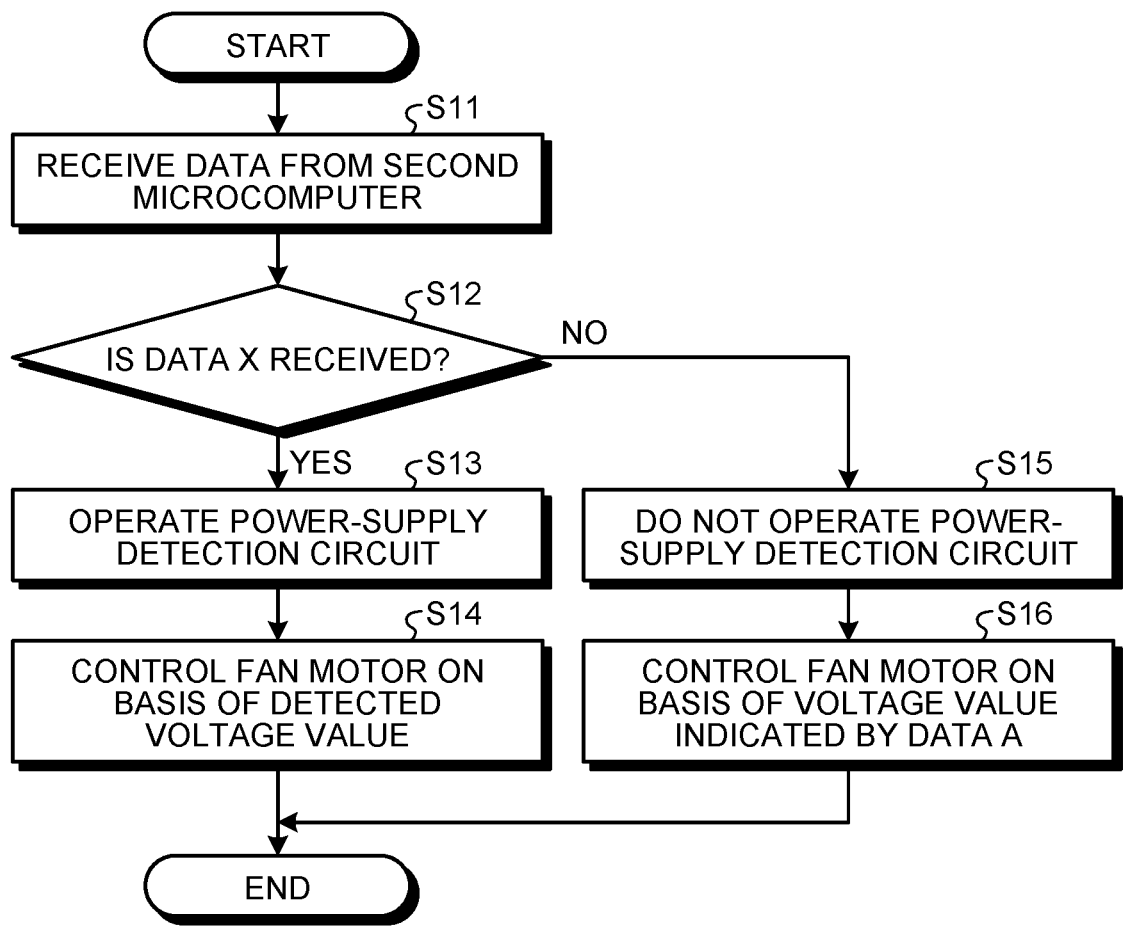

POWER-SUPPLY DETECTION-CIRCUIT CONTROL METHOD AND CIRCUIT SYSTEM

CROSS REFERENCE TO RELATED APPLICATION

This application is a U.S. national stage application of International Patent Application No. PCT/JP2018/038937 filed on Oct. 19, 2018, the contents of which are incorporated herein by reference.

FIELD

The present invention relates to a power-supply detection-circuit control method and a circuit system to control a power-supply detection circuit that detects a voltage to be applied from a power supply to a control-target device.

BACKGROUND

Conventionally, when a microcomputer that controls a control-target device is operating, the microcomputer constantly operates a power-supply detection circuit that detects a voltage to be applied from a power supply to the control-target device such that the microcomputer recognizes the voltage. Patent Literature 1 discloses a microcomputer system that can achieve a reduction in power consumption. In the invention described in Patent Literature 1, during the period for stopping power supply to a main CPU (Central Processing Unit) part, a sub CPU intermittently operates in accordance with a sub-clock signal. When it is determined that the condition for starting operation of the main CPU part is satisfied during the period for which the sub CPU is operating, the main CPU part is supplied with power and thus activated.

CITATION LIST

Patent Literature

Patent Literature 1: Japanese Patent Application Laid-open No. 2009-116851

SUMMARY

Technical Problem

A conventional circuit system includes a microcomputer and a power-supply detection circuit that detects a voltage to be applied from a power supply to a control-target device. In this conventional circuit system, although there are not significant variations in the value of voltage detected by the power-supply detection circuit, that is, although the power supply applies a voltage to the control-target device in a stabilized manner, the power-supply detection circuit still constantly operates. This leads to a waste of power consumption.

The present invention has been made in view of the above, and an object of the present invention is to provide a power-supply detection-circuit control method to reduce the amount of power consumed by a circuit system including a microcomputer that is connected to a power-supply detection circuit configured to detect a voltage to be applied to a control-target device, and that controls the control-target device.

Solution to Problem

In order to solve the above problem and achieve the object, a power-supply detection-circuit control method according to the present invention is a method for a microcomputer to control operation of a power-supply detection circuit, the microcomputer being connected to the power-supply detection circuit and controlling a control-target device, the power-supply detection circuit detecting a voltage to be applied from a power supply to the control-target device, wherein the microcomputer switches the power-supply detection circuit between an operating state and a non-operating state on a basis of information indicating whether a predetermined condition is satisfied.

Advantageous Effects of Invention

The power-supply detection-circuit control method according to the present invention has an effect where it is possible to reduce the amount of power consumed by a circuit system including a microcomputer that is connected to a power-supply detection circuit configured to detect a voltage to be applied to a control-target device, and that controls the control-target device.

BRIEF DESCRIPTION OF DRAWINGS

FIG. 2 is a flowchart illustrating a procedure for operation of a second microcomputer included in the circuit system according to the present embodiment.

FIG. 3 is a flowchart illustrating a procedure for operation of a first microcomputer included in the circuit system according to the present embodiment.

DESCRIPTION OF EMBODIMENTS

Figure 1:
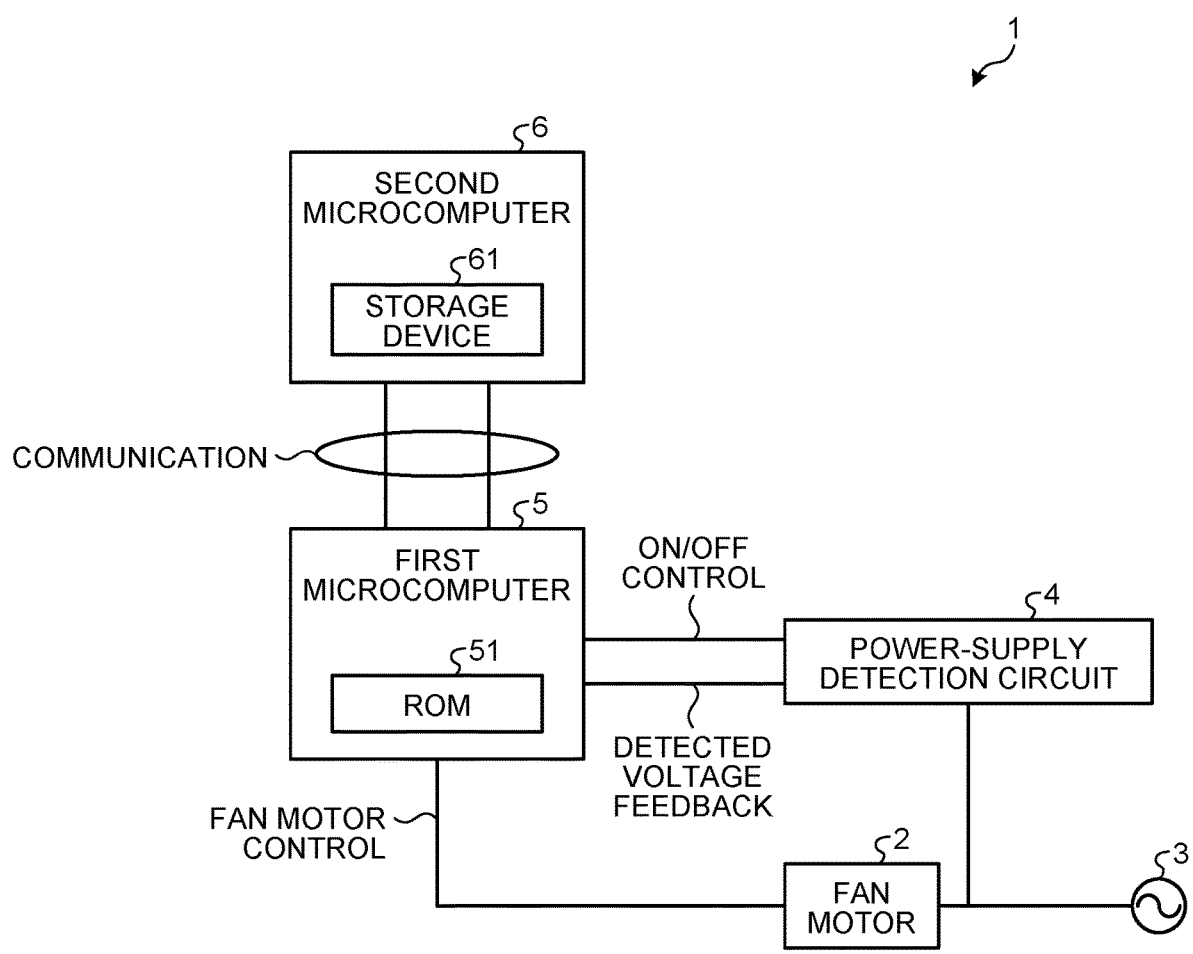
FIG. 1 is a diagram illustrating a configuration of a circuit system according to an embodiment.

A power-supply detection-circuit control method and a circuit system according to an embodiment of the present invention will be described in detail below with reference to the accompanying drawings. The present invention is not limited to the embodiment.

Embodiment

FIG. 1 is a diagram illustrating a configuration of a circuit system 1 according to an embodiment. In the present embodiment, the circuit system 1 is assumed to be located in an indoor unit of an air-conditioning device. The circuit system 1 includes a fan motor 2. The fan motor 2 is an example of a control-target device. The circuit system 1 further includes a power supply 3 that applies a voltage to the fan motor 2, and a power-supply detection circuit 4 that detects a voltage to be applied from the power supply 3 to the fan motor 2.

The circuit system 1 further includes a first microcomputer 5 that is connected to the power-supply detection circuit 4 and that controls the fan motor 2. The first microcomputer 5 also controls operation of the power-supply detection circuit 4 during operation during which a low power-consumption mode is not set. Specifically, the first microcomputer 5 switches the power-supply detection circuit 4 between an operating state and a non-operating state on the basis of information indicating whether a predetermined condition is satisfied. In FIG. 1, the operating state of the power-supply detection circuit 4 is illustrated as "on", while the non-operating state of the power-supply detection circuit 4 is illustrated as "off". The low power-consumption mode is, for example, a sleep mode.

Furthermore, the first microcomputer 5 does not operate the power-supply detection circuit 4 when the voltage detected by the power-supply detection circuit 4 is a predetermined stabilized voltage. The first microcomputer 5 has a function of receiving from the power-supply detection circuit 4 information indicating the value of voltage detected by the power-supply detection circuit 4. The first microcomputer 5 receives from the power-supply detection circuit 4 information indicating the value of voltage detected by the power-supply detection circuit 4, and FIG. 1 illustrates this reception of the information as "detected voltage feedback". The first microcomputer 5 includes a read-only memory 51 that stores therein information indicating a specific voltage value. Hereinafter, the read-only memory 51 is described as "ROM 51". In FIG. 1, the read-only memory 51 is described as "ROM 51".

The circuit system 1 further includes a second microcomputer 6 that communicates with the first microcomputer 5. The second microcomputer 6 has a function of determining whether a predetermined condition is satisfied. The second microcomputer 6 is provided with a storage device 61 that stores therein information indicating a specific voltage value. The storage device 61 is a device outside the first microcomputer 5 and the power-supply detection circuit 4. The storage device 61 is, for example, an EEPROM (registered trademark) (Electrically Erasable Programmable Read-Only Memory).

When the power-supply detection circuit 4 is not operating, the first microcomputer 5 controls the fan motor 2 on the basis of the voltage value indicated by the information stored in the ROM 51, or on the basis of the voltage value indicated by the information stored in the storage device 61.

Next, operation of the first microcomputer 5 and the second microcomputer 6 that are included in the circuit system 1 is described. First, the operation of the second microcomputer 6 is described. FIG. 2 is a flowchart illustrating a procedure for the operation of the second microcomputer 6 included in the circuit system 1 according to the present embodiment. When the power supply source of the circuit system 1 is turned on, the operation of the second microcomputer 6 starts. The power supply source is not illustrated in FIG. 1.

The second microcomputer 6 obtains from the storage device 61 data A indicating an instruction not to operate the power-supply detection circuit 4 (S1). The data A also indicates a specific voltage value. The second microcomputer 6 starts counting the elapsed time from when the second microcomputer 6 has obtained the data A (S2). The second microcomputer 6 determines whether the elapsed time is equal to or longer than Y seconds that are a predetermined time (S3). Y is a positive number. When the second microcomputer 6 determines that the elapsed time is not equal to or longer than Y seconds (NO at S3), the second microcomputer 6 performs the operation at Step S3 again.

When the second microcomputer 6 determines that the elapsed time is equal to or longer than Y seconds (YES at S3), the second microcomputer 6 determines whether the power supply 3 is stabilized (S4). Specifically, at Step S4, the second microcomputer 6 determines whether a condition 1 or a condition 2 is satisfied. When determining that the condition 1 or the condition 2 is satisfied, the second microcomputer 6 determines that the power supply 3 is stabilized. When determining that the condition 1 and the condition 2 are not satisfied, the second microcomputer 6 determines that the power supply 3 is not stabilized.

The condition 1 is satisfied when the rotational speed of the fan motor 2 is equal to or higher than a threshold, air is delivered from the indoor unit to a room in a given direction, and the set temperature for the indoor unit is set at a certain fixed value. The threshold, the given direction, and the fixed value, which are described above, are set in an arbitrary manner. The condition 2 is satisfied when the rotational speed of the fan motor 2 remains unchanged from a certain value for a certain period of time. The certain value and the certain period of time, which are described above, are set in an arbitrary manner. Each of the condition 1 and the condition 2 is an example of the predetermined condition.

When determining that the power supply 3 is stabilized (YES at S4), the second microcomputer 6 transmits to the first microcomputer 5 the data A indicating an instruction not to operate the power-supply detection circuit 4 (S5). When determining that the power supply 3 is not stabilized (NO at S4), the second microcomputer 6 transmits to the first microcomputer 5 data x indicating an instruction to operate the power-supply detection circuit 4 (S6). The second microcomputer 6 performs the operation at Step S5 or the operation at Step S6, and then ends a series of operations. It is allowable that after having ended the series of operations, the second microcomputer 6 performs the operations at Step S3 and the subsequent steps again.

Next, the operation of the first microcomputer 5 is described. FIG. 3 is a flowchart illustrating a procedure for the operation of the first microcomputer 5 included in the circuit system 1 according to the present embodiment. When the power supply source of the circuit system 1 is turned on, the operation of the first microcomputer 5 starts.

The first microcomputer 5 receives data from the second microcomputer 6 (S11). The first microcomputer 5 determines whether the received data is the data X indicating an instruction to operate the power-supply detection circuit 4 (S12). When determining that the received data is the data X (YES at S12), the first microcomputer 5 determines that the power supply 3 is not stabilized, and thus operates the power-supply detection circuit 4 (S13). After having performed the operation at Step S13, the first microcomputer 5 controls the fan motor 2 on the basis of the value of voltage detected by the power-supply detection circuit 4 (S14). Specifically, at Step S14, the first microcomputer 5 controls the rotational speed of the fan motor 2 on the basis of the value of voltage detected by the power-supply detection circuit 4.

When determining that the received data is not the data X (NO at S12), that is, when determining that the received data is the data A (NO at S12), the first microcomputer 5 determines that the power supply 3 is stabilized, and thus does not operate the power-supply detection circuit 4 (S15). After having performed the operation at Step S15, the first microcomputer 5 controls the fan motor 2 on the basis of the voltage value indicated by the data A (S16). Specifically, at Step S16, the first microcomputer 5 controls the rotational speed of the fan motor 2 on the basis of the voltage value indicated by the data A.

As described above, the first microcomputer 5 included in the circuit system 1 switches the power-supply detection circuit 4 between an operating state and a non-operating state on the basis of information indicating whether a predetermined condition is satisfied. That is, the power-supply detection circuit 4 does not continuously operate. Furthermore, there is a period of time during which the power-supply detection circuit 4 does not operate. Therefore, the power-supply detection-circuit control method according to the present embodiment can reduce the amount of power consumed by the circuit system 1 compared to the conventional circuit system.

In the embodiment described above, the circuit system 1 is assumed to be located in the indoor unit of the air-conditioning device. However, the circuit system 1 is not limited to being located in the indoor unit. Even in a case where the circuit system 1 is not located in the indoor unit, the first microcomputer 5 still switches the power-supply detection circuit 4 between an operating state and a non-operating state on the basis of information indicating whether a predetermined condition is satisfied. That is, even in a case where the circuit system 1 is not located in the indoor unit, the amount of power consumed by the circuit system 1 is still reduced as compared to that of the conventional circuit system.

The fan motor 2 included in the circuit system 1 according to the above embodiment is an example of the control-target device as described above. The control-target device is not limited to the fan motor 2.

The configurations described in the above embodiment are only examples of the content of the present invention. The configurations can be combined with other well-known techniques, and part of each of the configurations can be omitted or modified without departing from the gist of the present invention.

REFERENCE SIGNS LIST

1 circuit system, 2 fan motor, 3 power supply, 4 power-supply detection circuit, 5 first microcomputer, 6 second microcomputer, 51 read-only memory, 61 storage device.

The invention claimed is:

1. A power-supply detection-circuit control method for a microcomputer to control operation of a power-supply detection circuit, the microcomputer being connected to the power-supply detection circuit and controlling a control-target device, the power-supply detection circuit detecting a voltage to be applied from a power supply to the control-target device, wherein
    the microcomputer switches the power-supply detection circuit between an operating state and a non-operating state on a basis of information indicating whether a predetermined condition is satisfied, and
    the microcomputer does not operate the power-supply detection circuit when a voltage detected by the power-supply detection circuit is a predetermined stabilized voltage.

2. A power-supply detection-circuit control method for a microcomputer to control operation of a power-supply detection circuit, the microcomputer being connected to the power-supply detection circuit and controlling a control-target device, the power-supply detection circuit detecting a voltage to be applied from a power supply to the control-target device, wherein
    the microcomputer switches the power-supply detection circuit between an operating state and a non-operating state on a basis of information indicating whether a predetermined condition is satisfied, and
    the microcomputer includes a read-only memory, and when the power-supply detection circuit is not operating, the microcomputer controls the control-target device on a basis of a voltage value indicated by information stored in the read-only memory, or on a basis of a voltage value indicated by information stored in a storage device outside the microcomputer and the power-supply detection circuit.

3. A circuit system comprising:
    a power-supply detection circuit to detect a voltage to be applied from a power supply to a control-target device; and
    a microcomputer connected to the power-supply detection circuit, the microcomputer controlling the target device on the basis of a voltage detected by the power supply detection circuit, wherein
    the microcomputer switches the power-supply detection circuit between an operating state and a non-operating state on a basis of information indicating whether a predetermined condition is satisfied, and
    the microcomputer does not operate the power-supply detection circuit when a voltage detected by the power-supply detection circuit is a predetermined stabilized voltage.

* * * * *